(12) United States Patent
Yu et al.

(10) Patent No.: US 10,838,305 B2
(45) Date of Patent: Nov. 17, 2020

(54) LITHOGRAPHIC MASK CORRECTION USING VOLUME CORRECTION TECHNIQUES

(71) Applicant: TAIWAN SEMICONDUCTOR MANUFACTURING CO., LTD., Hsinchu (TW)

(72) Inventors: Zhiru Yu, Hsinchu (TW); Danping Peng, Hsinchu (TW); Junjiang Lei, Hsinchu (TW); Yuan Fang, Durham, NC (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/396,529

(22) Filed: Apr. 26, 2019

(65) Prior Publication Data

US 2020/0004161 A1    Jan. 2, 2020

Related U.S. Application Data

(60) Provisional application No. 62/692,340, filed on Jun. 29, 2018.

(51) Int. Cl.
| | | |
|---|---|---|
| G03F 7/20 | (2006.01) | |
| G03F 1/36 | (2012.01) | |
| G03F 7/00 | (2006.01) | |
| G03F 1/26 | (2012.01) | |

(52) U.S. Cl.
CPC .......... *G03F 7/70191* (2013.01); *G03F 1/26* (2013.01); *G03F 1/36* (2013.01); *G03F 7/001* (2013.01); *G03F 7/705* (2013.01)

(58) Field of Classification Search
CPC .......... G03F 1/36; G03F 1/72; G03F 7/70191; G03F 1/26; G03F 7/001; G03F 7/705
USPC .......................................................... 716/50
See application file for complete search history.

(56) References Cited

U.S. PATENT DOCUMENTS

| | | |
|---|---|---|
| 7,383,530 B2 | 6/2008 | Wang et al. |
| 8,631,360 B2 | 1/2014 | Wang et al. |
| 8,739,080 B1 | 5/2014 | Tsai et al. |
| 8,745,550 B2 | 6/2014 | Cheng et al. |
| 8,972,908 B2 | 3/2015 | Chen et al. |
| 9,367,655 B2 | 6/2016 | Shih et al. |
| 9,390,217 B2 | 7/2016 | Wang et al. |
| 9,679,100 B2 | 6/2017 | Cheng et al. |
| 2007/0213962 A1* | 9/2007 | Adam ................ G03F 1/36 703/2 |
| 2011/0283244 A1 | 11/2011 | Abdo et al. |
| 2014/0114634 A1 | 4/2014 | Song et al. |
| 2014/0220786 A1 | 8/2014 | Lukanc et al. |
| 2015/0113486 A1 | 4/2015 | Wang |
| 2017/0269480 A1* | 9/2017 | Finders ................ G03F 1/72 |

* cited by examiner

*Primary Examiner* — Paul Dinh
(74) *Attorney, Agent, or Firm* — McDermott Will & Emery LLP

(57) ABSTRACT

A method of making a mask includes computing a mask volume correction matrix for a given mask layout to be used to perform a lithography process. The mask volume correction matrix represents a diffraction field for a predetermined thickness of a material of the mask. A simulated mask pattern is computed by applying the mask volume correction matrix to the given mask layout. The simulated mask pattern is provided to a mask making tool.

19 Claims, 9 Drawing Sheets

LITHOGRAPHIC MASK CORRECTION USING VOLUME CORRECTION TECHNIQUES

CROSS REFERENCE TO RELATED APPLICATIONS

This application claims priority to U.S. Provisional Application No. 62/692,340 filed on Jun. 29, 2018, entitled "Mask Making Method," the entire disclosure of which is incorporated herein by reference.

BACKGROUND

Creating accurate masks used in lithography processes for making integrated circuits is more challenging as the feature sizes of integrated circuits get smaller. As the feature size decreases below the diffraction limit of the illuminating radiation used in lithography, distortions resulting from higher order optical effects can create unwanted features in the pattern generated on the wafer. Further, as pattern density increases, intensity of light diffracted from neighboring patterns is no longer negligible. Moreover, the variation in the lens pupil function across the exposure slit is not negligible for smaller wavelengths, such as those used in extreme ultraviolet (EUV) lithography.

The pattern written on the photomask pre-compensates for the potential distortions through the various optical and chemical processes such that the desired pattern is printed on the wafer after the distortions. The pre-compensated pattern is often run through a simulation of the lithography process using a calibrated lithography model to verify that the pre-compensated pattern results in printing of the desired pattern on the wafer. The calibrated lithography model takes into account the various optical and chemical processes during the lithography step. The verified pre-compensated pattern is then printed on the photomask which is used for the manufacturing process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
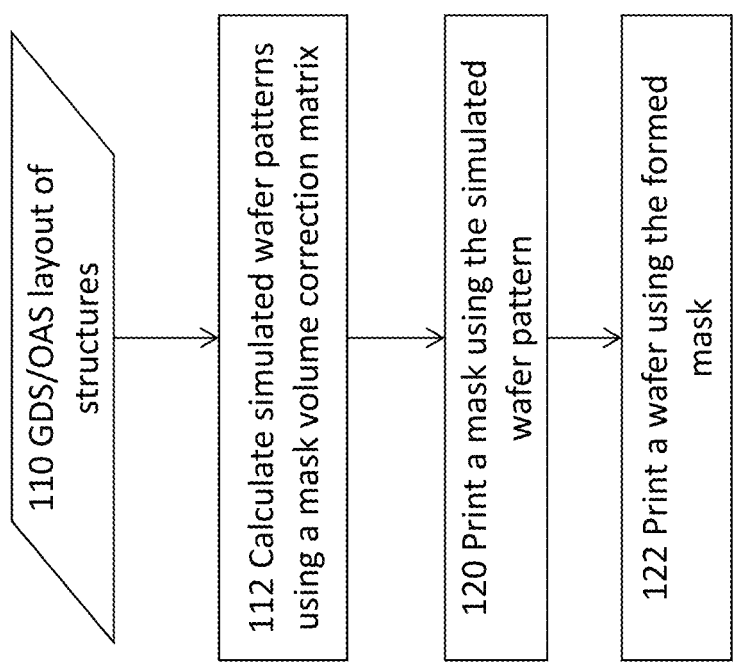
FIG. 1 illustrates a flow chart for a method of making a mask for lithography according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

While methods disclosed herein are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Terms like "simulate," "optimize," "adjust," "creating," "manufacture," "fabricate," "make," "form," "compare," "generate," "choose," "determine," "calculate," "measure," are used to describe operations of the disclosed methods, apparatus, or system. These terms denote the operations that are performed, for example, by one or more computers connected to or disconnected from a network and having a user interface to receive the user/designer's inputs and/or commands and a data communication interface or a network interface so as to exchange data with semiconductor manufacturing tools including, but not limited to, a lithography tool and an e-beam writer, and semiconductor testing (or characterization, measurement, or metrology) tools including, but not limited to, a scanning electron microscope. The operations that correspond to these terms can vary depending on the particular implementation and are readily discernible by one of ordinary skill in the art.

Some or all of the disclosed techniques/operations/steps can be implemented in whole or in part by software comprising computer-executable instructions stored on a computer-readable medium. Such software can comprise, for example, an appropriate electronic design automation ("EDA") software tool. Such software can be executed on one or more computers or computer systems. For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware such as processors, transitory and non-transitory memory devices, and various circuits.

Because of the complexity of some electronic design automation processes and the large size of many circuit designs, various electronic design automation tools are configured to operate on a computing system capable of simultaneously running multiple processing threads or multiple processors. The components and operation of a computer network may include a host or master computer and one or more remote or servant computers.

Any data produced from any of the disclosed methods (e.g., intermediate or final test patterns, test pattern values, parameters, or control data) can be stored on a computer-readable storage medium (e.g., tangible computer-readable medium, such as one or more critical dimensions (CDs), volatile memory components (such as Dynamic Random Access Memory (DRAM) or Static Random Access Memory (SRAM)), or nonvolatile memory components (such as hard drives)), using a variety of different data structures or formats. Such data can be created, updated, or stored using a local computer or over a network (e.g., by a server computer), and can be exchanged among the computers, the semiconductor manufacturing tools, and the semiconductor testing tools.

In some embodiments, a photomask refers to a patterned substrate used in a lithography process to pattern a photoresist coated on a semiconductor wafer. In the following description, photomask, mask and reticle are used exchangeably. Although only one photomask is to be described in some embodiments, one of ordinary skill in the art should understand that more photomasks can be manufactured in accordance with design principle of this disclosure so that various layers can be made with the photomasks to construct an integrated circuit.

In some embodiments, mask layout, mask data, or electron beam shot map refer to a type of electronic file or data, which is readable by a semiconductor manufacturing tool or a semiconductor testing tool to allow the semiconductor manufacturing tool or the semiconductor testing tool to obtain information contained in the electronic file or data. The information includes, but is not limited to, locations in a mask to be manufactured and properties of such locations (i.e., whether to allow portions of a photoresist layer to remain or be removed after being exposed with the manufactured mask based on such electronic file or data, followed by a developing process).

In some embodiments, a semiconductor manufacturing tool or a semiconductor testing tool refers to a tool including, but not limited to, one of a motor; optical components such as a light source or lens; an image capturing device; and a computer including a processor; a user interface; transitory and/or non-transitory computer-readable storage medium; and software, program, or instructions stored on the non-transitory computer-readable medium, that when executed, cause the processor of the computer to generate commands to control operations of hardware or software modules of the semiconductor manufacturing tool or the semiconductor testing tool.

Light scattering from a 3D mask with multiple layers is a nonlinear process determined by complicated electromagnetic interactions. Rigorous electromagnetic solvers can numerically formulate the physics of how the radiation interacts with a given mask. Electromagnetic field interactions between mask features are accurately modeled using such rigorous solvers. However, computing these interactions with rigorous formulation is computationally expensive. As used herein, the terms "rigorous simulation," "rigorous solver" or "rigorous computation model" interchangeably refer to a computation model that numerically computes the interaction of the radiation with the mask material, the resist material and/or the substrate underlying the resist material during an exposure without making simplifying assumptions using ab initio computation.

Simplified linear models that describe light scattering from a 3D mask can only be applied to simple features on the mask such as a line-space pattern (e.g., a grating) or 2D Manhattan patterns. Complicated features such as corner rounded pattern, side-wall angle and sub-resolution assist features cannot be computed using these models. For example, Kirchhoff approximation (or thin mask model) ignores all field interactions between edges. Only open and close frame diffraction of the mask is used. Moreover, Kirchhoff approximation is only applicable when features on the mask are large compared to the wavelength of the light source.

On the other hand, the domain decomposition method (DDM) approximates edge to edge interactions in 1D mask patterns and extends it to 2D mask patterns. However, off-axis illumination, which is common in Deep Ultraviolet (DUV) lithography with coherent groups and Extreme Ultraviolet (EUV) lithography, generates shadowing effects on the mask. Geometry shadowing is used to model this effect. Domain decomposition method (DDM) cannot correctly model shadowing effects and edge-edge interactions. These effects can cause substantial deviation between simulation and measurement data.

According to methods described herein, diffraction fields are calculated with the volume of mask features. Non-linear physical effects are handled by a pre-computed kernel, and pattern dependent effects are handled using a pattern-dependent characteristic function. Results can be refined iteratively by comparing the results of the present methods with the results of a rigorous computational model for a 1D mask.

Methods described herein are flexible and are applicable to masks with rounded corner features, side-wall angles and even small features including sub-resolution assist features.

Moreover, accuracy of these methods can be improved iteratively, thereby providing an optimal trade-off between mask correction accuracy and processing time.

Further, because the calculations in the present methods improve mask fields over traditional methods, the present methods can be easy add-ons to traditional mask correction processes.

FIG. 1 illustrates a flow chart for a method of making mask for lithography according to some embodiments. The method includes, at 110, forming a layout of test structures (or of an IC). The layout of the test structures (or of the IC) is formed in a data format such as, for example, a graphic data system (GDS or GDSII) or an open artwork system interchange standard (OASIS or OAS) proposed by Semiconductor Equipment and Materials International (SEMI) in various embodiments. In some embodiments, the layout is generated using a computer implementing electronic design automation (EDA) software or tool. For the purposes of the present disclosure, unless explicitly stated otherwise or made clear by the context, the terms "layout", "mask layout", "IC layout", and "test layout" are used interchangeably.

In some embodiments, the test design layout or the IC design layout includes one or more layers of circuit patterns designed for an IC product, based on the specification of the IC product. The layout is designed by a designer in some embodiments. In one example, the designer is a design house. In another example, the designer is a design team separated from a semiconductor manufacturer that is capable of making IC products according to the IC design layout. In various embodiments, the semiconductor manufacturer is capable of making photomasks, IC products, or both. The designer, based on the specification of the product to be manufactured, implements a proper design procedure to generate the IC design layout. The design procedure includes logic design, physical design, and/or place and route in some embodiments. As an example, a portion of the IC design layout includes various IC features (also referred to as main features), such as active regions, doped wells, source and drains, gate electrodes, vias/contacts and metal lines of the interlayer interconnection, and openings for bonding pads, to be formed in a semiconductor substrate (such as a silicon wafer) and various material layers disposed over the semiconductor substrate. The IC design layout, in some embodiments, also includes certain assist features, such as those features for imaging effect, process or product testing and/or calibration, and/or mask identification information.

In a case in which the layout is generated by a design house other than the semiconductor manufacturer, the method additionally includes another operation receiving, by the semiconductor manufacturer, electronic data of the generated layout delivered from the design house. The electronic data of the generated layout can be delivered by internet or a portable data storage, or combination thereof. The semiconductor manufacturer can use the received electronic data of the generated layout to perform the remaining operations.

At 112, a simulated wafer pattern is calculated using a mask volume correction matrix on the layout formed at 110. In some embodiments, the mask volume correction matrix represents a correction for a 2D diffraction field after accounting for 3D diffraction effects from a predetermined thickness of the mask. In some embodiments, accuracy of the mask volume correction matrix is improved by iteratively adjusting, e.g., a mask material compensation kernel. The mask material compensation kernel represents the effect of the mask material on the diffraction field, for example, caused by reflection, refraction and diffraction of the incident radiation field by the mask material.

At 120, a mask of test structures is formed based on the simulated wafer pattern generated at 112. The mask is made by a mask making process, performed by a photomask manufacturing tool such as an electron-beam (e-beam) writer using the mask data (e.g., the simulated wafer pattern generated at 112). In some embodiments, an e-beam or a mechanism of multiple e-beams is used to form a pattern on the mask based on the simulated wafer pattern generated at 112. The mask can be designed in various suitable technologies. In one embodiment, the mask is designed to have a binary pattern. In this case, the mask pattern includes dark regions and bright regions. The radiation beam (e.g. ultraviolet or electron beam), used to expose the photo-sensitive material layer (such as photoresist) coated on a wafer, is blocked by the dark region and transmits through the bright regions. In one example, the binary mask includes a transparent substrate (e.g., fused quartz), and an opaque material (e.g., chromium) coated in the dark regions of the mask. A binary mask is a positive mask in some embodiments, while in other embodiments a binary mask is a negative mask.

In another embodiment, the mask is designed to have phase shift and can be referred to as a phase shift mask, various features in the pattern formed on the mask are configured to have appropriate phase difference to enhance the resolution and imaging quality. In various examples, the phase shift mask can be an attenuated phase shift mask or an alternating phase shift mask.

In some other embodiments, the mask is an extreme ultraviolet (EUV) mask having a reflective pattern. In one example, the EUV mask includes a substrate with a suitable material, such as a low thermal expansion material (LTE) or an ultra-low thermal expansion material (ULE). Examples of LTE and/or ULE materials include fused quartz, $TiO_2$ doped $SiO_2$, or other suitable materials. The EUV mask includes reflective multiple layers (ML) deposited on the substrate. In some embodiments, the ML includes a plurality of film pairs, such as molybdenum-silicon (Mo/Si) film pairs (e.g., a layer of molybdenum above or below a layer of silicon in each film pair). In other embodiments, the ML includes molybdenum-beryllium (Mo/Be) film pairs, or other suitable materials that are configurable to efficiently reflect the EUV light. The EUV mask further includes a capping layer, such as ruthenium (Ru), disposed on the ML for protection in some embodiments. The EUV mask further includes an absorption layer, such as a tantalum boron nitride (TaBN) layer, deposited over the ML in some embodiments. The absorption layer is patterned to define a layer of an integrated circuit (IC). Alternatively, another reflective layer may be deposited over the ML and is appropriately patterned to define a layer of an integrated circuit, thereby forming an EUV phase shift mask.

At 122, the mask formed at 120 is used to print a wafer using lithography techniques. In various embodiments, a layer of photosensitive material (sensitive to either DUV or EUV depending on the type of lithography technique being used and/or desired feature size) is provided on a substrate wafer and exposed to an actinic radiation (i.e., DUV or EUV) beam transmitted through or reflected from the mask formed at 120. In some embodiments, the substrate wafer is an unpatterned wafer, and in other embodiments, the substrate wafer has one or more patterned layers with patterns previously printed using lithography, deposition and/or etching processes. In embodiments where the mask formed at 120 includes test structures used for calibration of the simulated wafer pattern generated at 112, an unpatterned substrate is used to avoid complexities resulting from uneven surface of a patterned substrate wafer. In some embodiments, the unpatterned substrate includes a silicon wafer with a layer of silicon dioxide or silicon nitride on top. The thickness of the silicon dioxide or silicon nitride is not particularly limited. In such embodiments, the photosensitive layer, e.g., of a photoresist material, is disposed on the silicon dioxide or silicon nitride layer, e.g., by spin coating, exposed to the actinic radiation beam through or reflected from the mask, and developed to form a patterned photoresist layer on the wafer. The pattern is then printed on the wafer by etching the silicon oxide or silicon nitride layer using the patterned photoresist layer as an etch mask. The photoresist layer is then removed in some embodiments. However, in some embodiments, for example, where measuring the characteristics of the photoresist itself is of interest the photoresist layer is not removed. In such embodiments, processing steps can be reduced by leaving the silicon dioxide or silicon nitride layer unetched.

Figure 2:
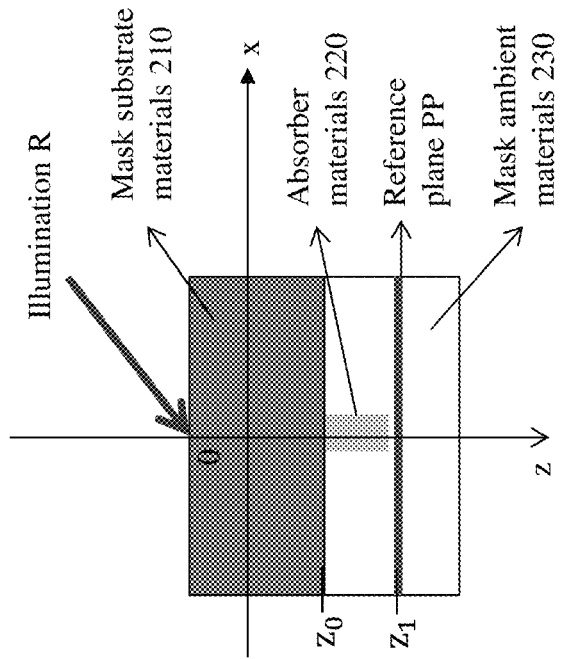
FIG. 2 schematically illustrates the reference points for computing 3D diffraction fields for a DUV mask according to some embodiments of the disclosure.

FIG. 2 schematically illustrates a DUV mask and reference points for computing 3D diffraction fields according to some embodiments of the disclosure. In an embodiment, the DUV mask includes a mask substrate 210, an absorber material 220 disposed on the mask substrate 210 in a desired pattern, and mask ambient materials 230 disposed on the mask substrate 210 and the pattern of the absorber material 220. The ambient material 230 serve to protect the mask substrate 210 and the pattern of the absorber material 220. When used in operation, the DUV mask is placed in a light path of illumination R which passes through or is absorbed by various materials of the DUV mask to form a pattern to which a photoresist material is exposed.

Figure 3:
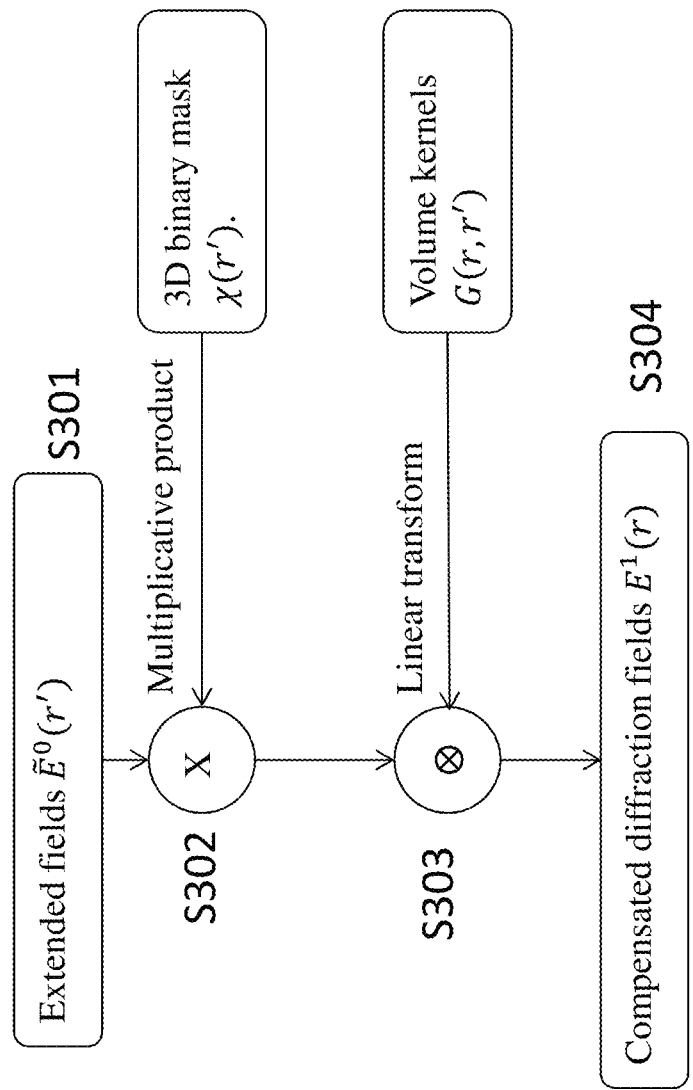
FIG. 3 illustrates a flow chart for a method of computing a corrected 2D diffraction field from a computed 3D diffraction field for a DUV mask according to some embodiments of the disclosure.

FIG. 3 illustrates a flow chart for a method of computing a corrected 2D diffraction field from a computed 3D diffraction field (e.g., as described with respect to FIG. 2), for a DUV mask in accordance with some embodiments of the disclosure. In an embodiment, the method includes, at S301, propagating a 2D diffraction field resulting from the interaction between the radiation R and various materials of the DUV mask backwards to compute a 3D diffraction field. An extension step extends 2D fields on reference plane PP (defined by r) to a 3D volume of interest (defined by r'). For example, if fields on reference plane are written in the frequency domain as:

$$E(r) = \sum_m \sum_n E_{mn} e^{jk_{x,mn}x} e^{jk_{y,mn}y} e^{jk_{z,mn}z_0} \quad \text{Eq. (1)}$$

then the backward propagated field is represented by:

$$\tilde{E}(r') = \sum_m \sum_n E_{mn} e^{jk_{x,mn}x} e^{jk_{y,mn}y} e^{jk_{z,mn}(z-z_0)} \quad \text{Eq. (2)}$$

wherein $k_x$, $k_y$, $k_z$ are components of vector wave number k of a particular field E. The vector wave number is represented as $k=(k_x, k_y, k_z)$. Assuming vector wave number k has a polar angle represented by $\theta$ and azimuthal angle represented by $\varphi$, then $k_x=|k|\times\cos(\theta)\times\sin(\varphi)$, $k_y=|k|\times\cos(\theta)\times\cos(\varphi)$, and $k_z=|k|\times\sin(\varphi)$. The absolute value of the vector wave number k is obtained as $|k|=2\pi f\, c_0\times\epsilon_r\times\mu_r$. Herein, f is frequency in Hz, $c_0$ is speed of light in vacuum ($3\times10^8$ m/s), $\epsilon_r$ is the relative permittivity and $\mu_r$ is the relative magnetic permeability of the background of the material within which the wave is propagating, r is a vector representing a location on a two dimensional plane and is represented as $r=(x, y, z_0)$ in Cartesian coordinates. Herein, x and y are arbitrary coordinates (variables) on the two dimensional plane and $z_0$ is a real scalar number specifying the z coordinate, $z_0$ is determined by the reference plane PP (FIG. 2). r' is a vector representing a location in a three dimensional space and is represented as $r'=(x,y,z)$ in Cartesian coordinate. x, y, z are arbitrary coordinates (variables) on a 3D volume. j is an imaginary number defined as $\sqrt{-1}$.

At S302, the extended 3D diffraction field is multiplied by a characteristic function representing the 3D binary mask. In an embodiment, the characteristic function $\chi(r')$, depends on the mask pattern and the materials of various mask layers. In other words, the characteristic function is specific to the mask for which the computation is being performed.

At S303, the multiplicative product from S302 is transformed using a volume kernel. In an embodiment, because the volume kernel is pattern independent and represents the physics of the interaction between the DUV radiation and the materials of the mask, the volume kernel can be pre-computed.

At S304, the compensated or corrected 2D diffraction fields $E^1(r)$ over the volume of the mask are computed using the transformed 3D fields, as:

Corrected 2D diffraction field=mask volume correction matrix×2D diffraction field=[3D diffraction field×$\chi(r')$]*$G(r,r')$ where $\chi(r')$ represents the pattern-dependent characteristic function, $G(r,r')$ represents the pattern-independent pre-computed kernel, '*' represents a convolution operation.

Figure 4:
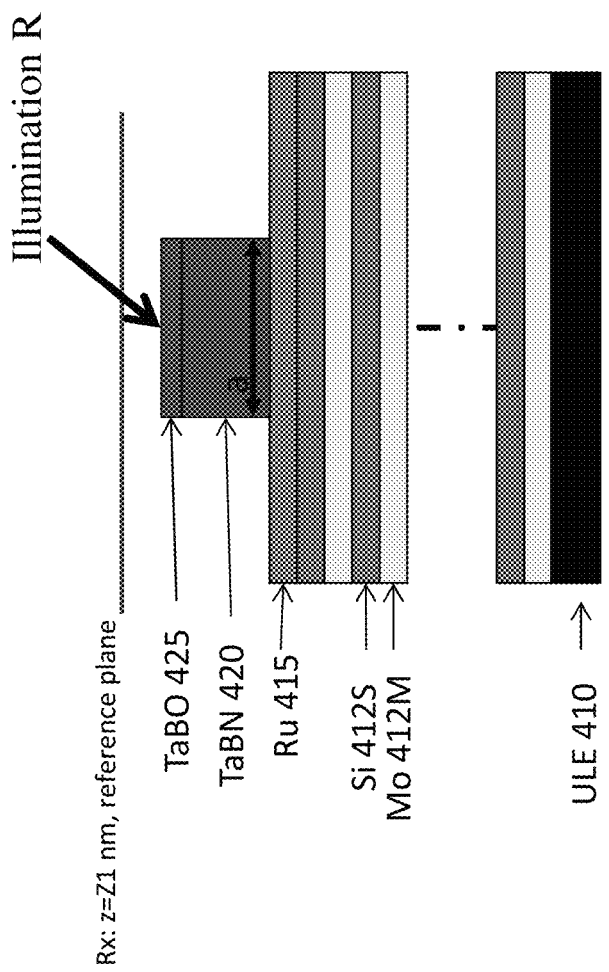
FIG. 4 schematically illustrates the reference points for computing 3D diffraction fields for a EUV mask according to some embodiments of the disclosure.

FIG. 4 schematically illustrates the reference points for computing 3D diffraction fields for an EUV mask according to some embodiments of the disclosure. In an embodiment, an EUV mask includes an ultra-low thermal expansion material (ULE) substrate 410; a multilayer stack of molybdenum thin films 412M and silicon thin films 412S which reflects the EUV from the mask; a capping layer 415 formed, for example, of a material such as ruthenium; and a 2-layer absorber layer including a TaBN layer 420 and a TaBO layer 425. The EUV mask illustrated in FIG. 4 includes a line pattern with a width (i.e., CD) of a and a pitch (i.e., spacing between neighboring lines) of P1. Radiation R is used for illuminating the pattern which reflects the radiation R on to the wafer. A plane Rx spaced at z=Z1 nm from the topmost surface of the TaBO layer 425 defines the reference plane.

Figure 5:
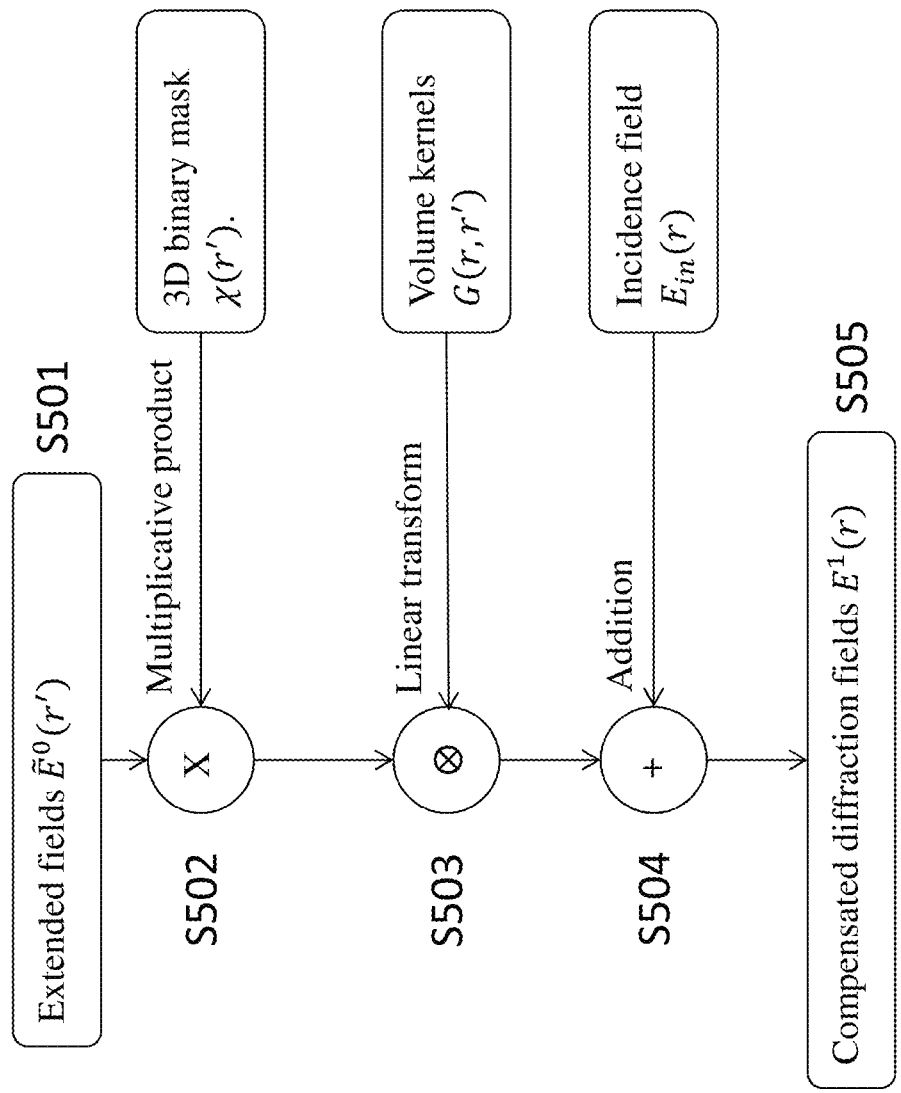
FIG. 5 illustrates a flow chart for a method of computing a corrected 2D diffraction field from a computed 3D diffraction field for a EUV mask according to some embodiments of the disclosure.

FIG. 5 illustrate a flow chart for a method of computing a corrected 2D diffraction field from a computed 3D diffraction field for an EUV mask (e.g., as described with respect to FIG. 4) in accordance with some embodiments of the disclosure. In an embodiment, the method includes, at S501, computing the extended fields $\tilde{E}^0(r')$ using, for example, Equation (2).

At S502, the extended 3D diffraction field is multiplied by a characteristic function $\chi(r')$ representing the 3D binary mask. In an embodiment, the characteristic function $\chi(r')$ is specific to the mask for which the computation is being performed.

At S503, the multiplicative product of the extended 3D diffraction field and the characteristic function is transformed using a volume kernel. In an embodiment, the volume kernel depends on the mask stack (i.e., the number and materials of the reflective multilayers, the material of the absorber and the material of the capping layer). Thus, if the materials of the EUV mask are different, the volume kernel changes. Because the volume kernel is independent of the pattern of the mask, it can be precomputed.

At S504, the incident field (or a factor thereof) is added to the transformed multiplicative product of the extended 3D diffraction field and the characteristic function. Because an EUV mask is a reflective mask, the reflected field interacts with the incident field as it traverses through the mask layers (and also at least up to a certain distance from the topmost surface of the mask).

At S505, corrected 2D diffraction fields $E^1(r)$ over the volume of the mask are computed using the transformed 3D fields as:

Corrected 2D diffraction field=mask volume correction matrix×2D diffraction field=[3D diffraction field×$\chi(r')$]*$G(r;r')$+$E_{in}(r)$ where $\chi(r')$ represents the pattern-dependent characteristic function, $G(r,r')$ represents the pattern-independent pre-computed kernel, $E_{in}(r)$ represents an incident optical field, the $E_{in}(r)$ being a fraction of an illumination radiation, and '*' represents a convolution operation.

Figure 6:
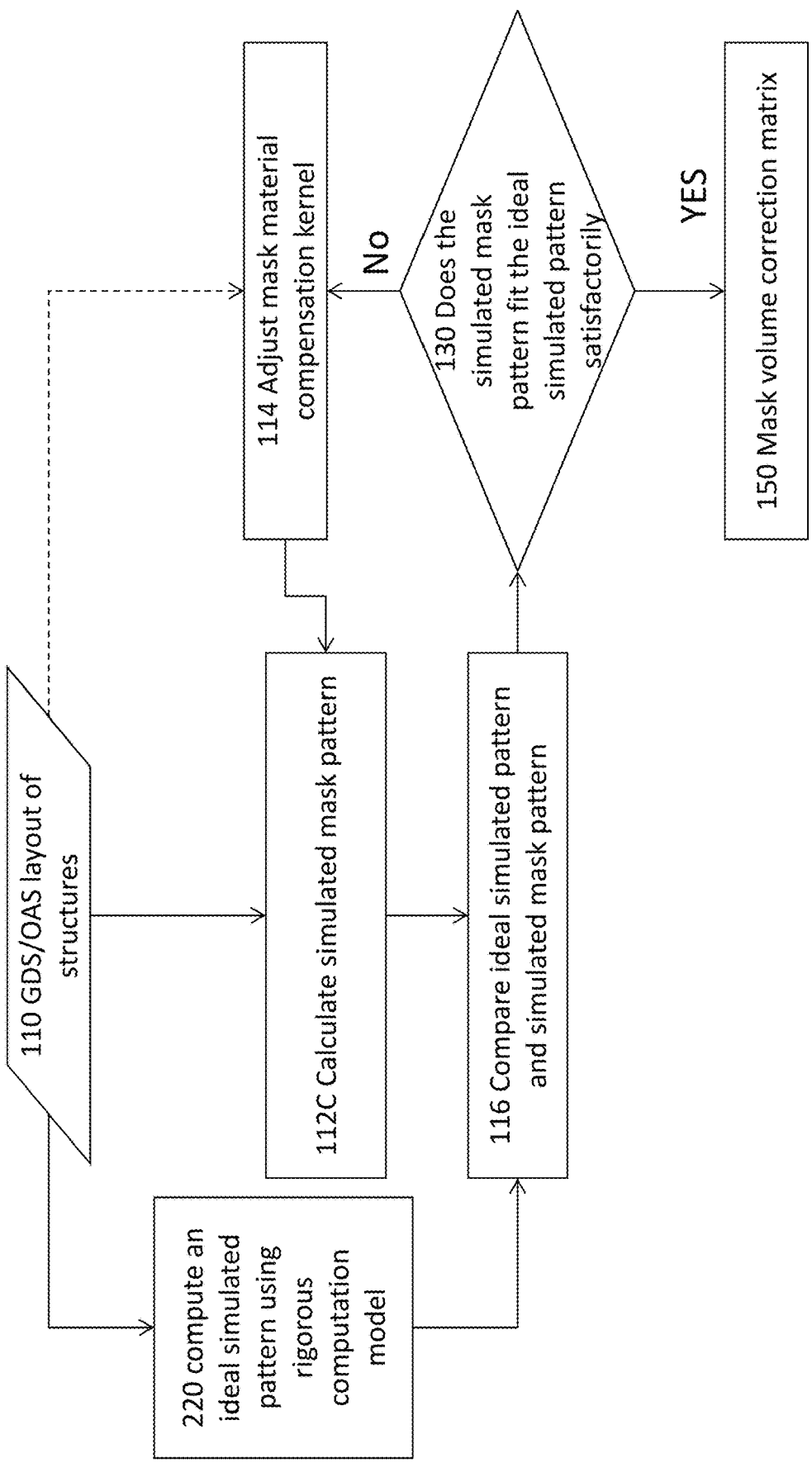
FIG. 6 illustrates a flow chart for computing a mask volume correction matrix for computing a simulated mask pattern based on 3D diffraction field according to some embodiments of the disclosure.

FIG. 6 illustrates a flow chart for computing a mask volume correction matrix for computing a simulated mask pattern based on 3D diffraction field according to some embodiments of the disclosure. In an embodiment, the method includes, at 110, generating a mask layout.

At 114 a mask material compensation kernel, representing the interaction of the mask material with radiation is initially computed. The initial mask material compensation kernel, in some embodiments, is computed using a corrected 2D diffraction field for a 1D mask.

At 112C, a simulated mask pattern is computed from a mask layout generated at 110 using the mask material compensation kernel.

Separately, at 220, an ideal simulated pattern is computed for a 1D mask using a rigorous computation model that numerically represents the physics of the mask. At 116, the ideal simulated pattern obtained at 220 is compared with the simulated mask pattern obtained at 112C. The mask material compensation kernel is then iteratively adjusted until the difference between the ideal simulated pattern obtained at 220 and the simulated mask pattern obtained at 112C is obtained to within a desirable accuracy (or the number of iterations has exceeded predetermined limit). For example, at 130, the difference between the ideal simulated pattern obtained at 220 and the simulated mask pattern obtained at 112C is compared with an accuracy threshold (or the number of iterations is counted). If the difference is less than the accuracy threshold (or if the number of iterations has exceeded the predetermined limit), at 150, the mask material compensation kernel obtained at that iteration is used to compute the mask volume correction matrix, which is then used to compute the corrected (or volume compensated) 2D diffraction field. If the difference is more than the accuracy threshold (or if the number of iterations is less than the predetermined limit), the mask material compensation kernel is adjusted at 114, and the simulated mask pattern is recalculated at 112C.

Figures 7A, 7B:
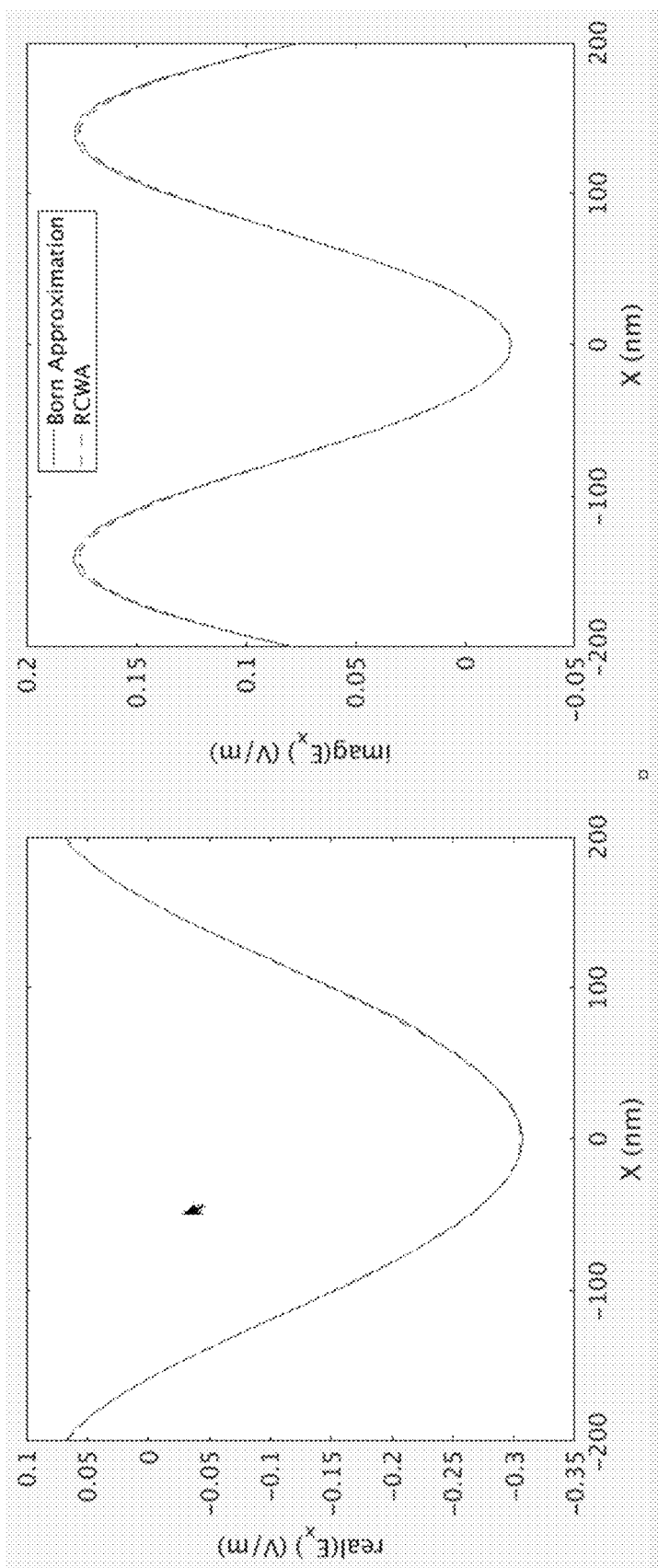
FIGS. 7A and 7B schematically illustrates a 1D DUV mask, and a comparison between the corrected 2D diffraction field using a method of the present disclosure and the diffraction field using rigorous computation model of the 1D DUV mask.

FIGS. 7A and 7B illustrate a comparison between the corrected 2D diffraction field using a method of the present disclosure and the diffraction field using a rigorous computation model of a 1D DUV mask. FIG. 7A depicts the comparison for the real part of the complex diffraction field, and FIG. 7B depicts the imaginary part of the complex diffraction field.

Figure 8:
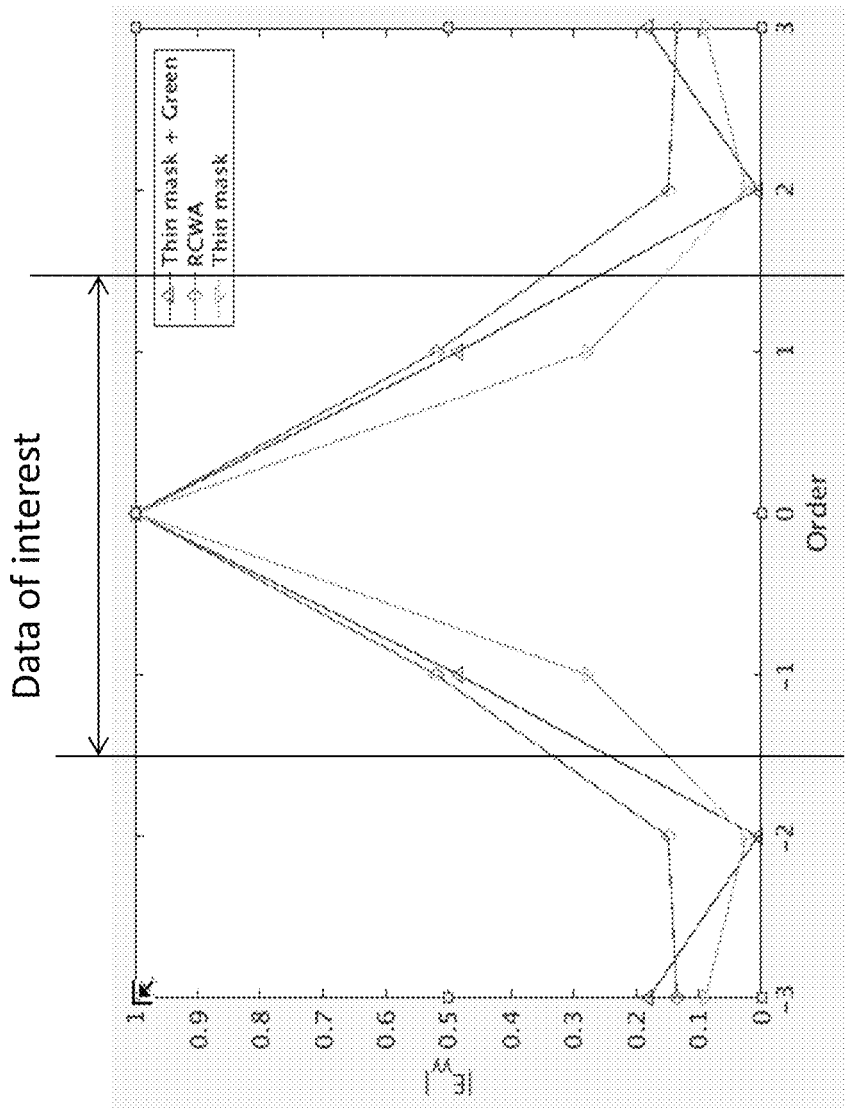
FIG. 8 illustrates a comparison between the corrected 2D diffraction field using a method of the present disclosure and the diffraction field using rigorous computation model of the 1D EUV mask.

FIG. 8 illustrates a comparison between the corrected 2D diffraction field using a method of the present disclosure, the diffraction field using the rigorous computation model and a method of related art for a 1D EUV mask. FIG. 8 depicts diffraction fields for various orders of diffraction for rigorous simulation (RCWA), thin mask approximation (2D fields according to related art) and thin mask+green function as kernel (volume compensated 2D fields according to the present disclosure). As can be seen in FIG. 8, for the first order of diffraction, the method of the present disclosure matches favorably with the rigorous simulation. However, because rigorous simulation is computationally expensive, the method of the present disclosure offers similar accuracy at significantly reduced computation cost.

Figure 9:
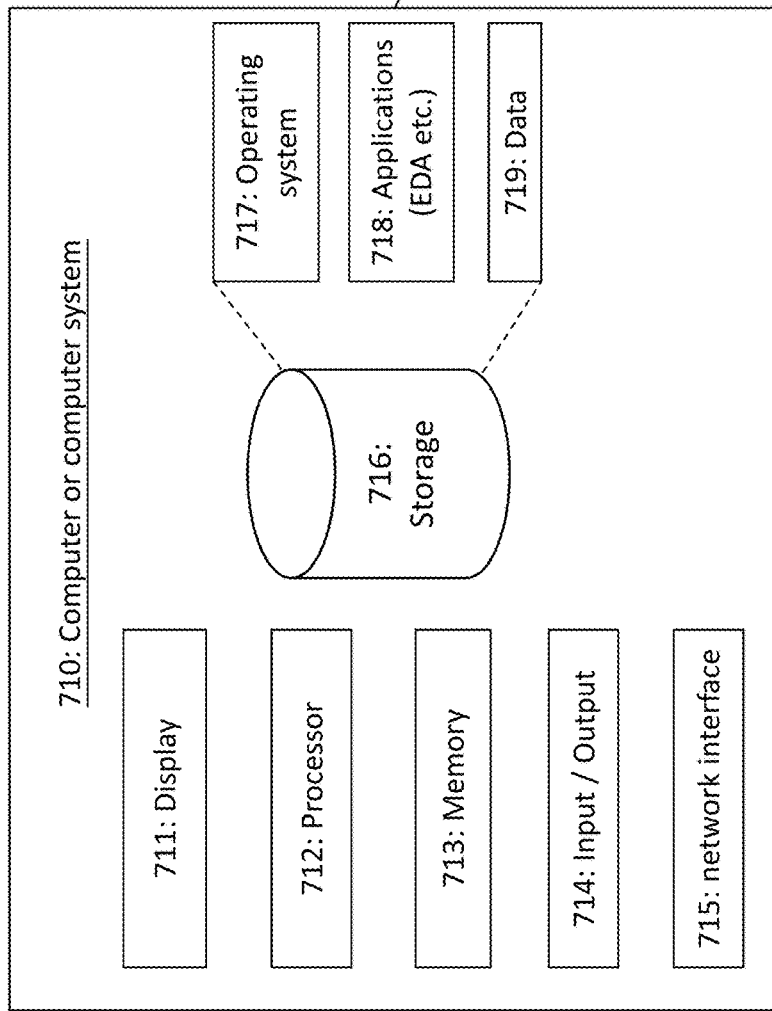
FIG. 9 illustrates a system for making an integrated circuit (IC) in accordance with some embodiments of the disclosure.
Figure 9:
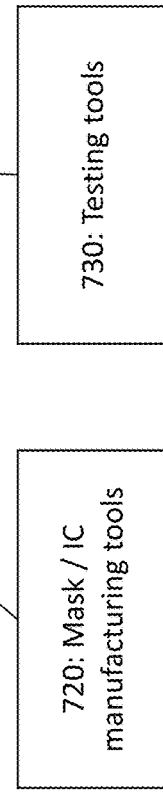

FIG. 9 illustrates a system for making an IC in accordance with some embodiments. The system 700 includes a computer or a computer system 710, mask and IC manufacturing tools 720, testing tools 730, and a wireless or wired network 740 connecting the computer system 710, the mask and IC manufacturing tools 720, and the testing tools 730 to each other to allow data exchange therebetween.

The computer or the computer system 710 includes a display 711, a processor 712, a memory 713, an input/output interface 714, a network interface 715, and a storage 716 storing an operating system 717, programs or application 718 such as EDA, and data 719.

The applications 718 can include instructions which, when executed by the computer or the computer system 710 (or the processor 712 thereof), causes the computer or the computer system 710 (or the processor 712 thereof) to perform operations, methods, and/or processes that are explicitly or implicitly described in the present disclosure.

The data 719 can include any default data including default parameters used in the modeling, any data that is received, for example, through the user input via input/output interface or through the network interface 715 transmitted from the mask/IC manufacturing tools 720 and/or testing tools 730, any data that is to be displayed on the display 711, any data that is to be transmitted to or from the mask/IC manufacturing tools 720 and/or testing tools 730 via the network 740, or any interim data generated during computation by the computer or computer system 710.

The mask and IC manufacturing tools 720 includes but are not limited to an e-beam writer or an e-beam lithography tool, a photolithography tool, etc., and the testing tools 730 include but not limited to a surface profile measurement tools such as a scanning electron microscope.

It will be understood that not all advantages have been necessarily discussed herein, no particular advantage is required for all embodiments or examples, and other embodiments or examples may offer different advantages.

According to an aspect of the present disclosure, a method of making a mask includes computing a mask volume correction matrix for a given mask layout to be used to perform a lithography process. The mask volume correction matrix represents a diffraction field for a predetermined thickness of a material of the mask. A simulated mask pattern is computed by applying the mask volume correction matrix to the given mask layout. The simulated mask pattern is provided to a mask making tool. In an embodiment, the mask volume correction matrix is computed by computing a pattern-independent pre-computed kernel and a pattern-dependent characteristic function. In an embodiment, the given mask layout corresponds to a mask for a deep ultraviolet (DUV) lithography process. In an embodiment, the given mask layout corresponds to a mask for an extreme ultraviolet (EUV) lithography process. In an embodiment, the mask volume correction matrix is computed by computing a 2D diffraction field for the given mask layout assuming a 2-dimensional mask condition. The 2D diffraction field is extended to the predetermined thickness of the material of the mask to obtain a 3D diffraction field representing a 3-dimensional diffraction field for the given mask layout provided in the material of the mask. A corrected 2D diffraction field is recomputed at a surface of the mask as a function of the 3D diffraction field. In an embodiment, the 2D diffraction field is represented by $E(r)=\Sigma_m\Sigma_n\Sigma_{mn}e^{jk_{x,mn}x}e^{jk_{y,mn}y}e^{jk_{z,mn}z_0}$, and the 3D diffraction field is represented by $\tilde{E}(r')=\Sigma_m\Sigma_n\Sigma_{mn}e^{jk_{x,mn}x}e^{jk_{y,mn}y}e^{jk_{z,mn}(z-z_0)}$. In an embodiment, the pattern-independent pre-computed kernel is computed by iteratively adjusting a mask material compensation kernel based on a difference between the simulated mask pattern and an ideal simulated pattern computed using a rigorous computation model for a test mask layout.

In an embodiment, the test mask layout comprises a line pattern. In an embodiment, the corrected 2D diffraction is represented by: Corrected 2D diffraction field=mask volume correction matrix×2D diffraction field=[3D diffraction field×$\chi(r')$]*$G(r,r')$, where $\chi(r')$ represents the pattern-dependent characteristic function, $G(r, r')$ represents the pattern-independent pre-computed kernel, '*' represents a convolution operation. In an embodiment, the corrected 2D diffraction is represented by: Corrected 2D diffraction field=mask volume correction matrix×2D diffraction field= [3D diffraction field×$\chi(r')$]*$G(r,r')$+$E_{in}(r)$, where $\chi(r')$ represents the pattern-dependent characteristic function, $G(r,r')$ represents the pattern-independent pre-computed kernel, $E_{in}(r)$ represents an incident optical field, the $E_{in}(r)$ being a fraction of an illumination radiation, and '*' represents a convolution operation.

Another embodiment of the disclosure is a method of making a mask including computing a characteristic function based on a desired layout of the mask. Volume kernel is computed based on an interaction of electric field with a predetermined thickness of a material of the mask. A volume compensated 2D diffraction field is computed for the desired layout of the mask by transforming a multiplicative product of a 2D diffraction field for the desired layout and the characteristic function using the volume kernel. A simulated mask pattern is computed using the volume compensated 2D diffraction field. The simulated mask pattern is provided to a mask making tool. In an embodiment, the desired layout corresponds to a mask for a DUV lithography process. In an embodiment, a factor of an incident field is added to the transformed multiplicative product of a 2D diffraction field for the desired layout and the characteristic function using the volume kernel to obtain the volume compensated 2D diffraction field. In an embodiment, the desired layout corresponds to a mask for an EUV lithography process. In an embodiment, the volume kernel is computed by computing a 3D diffraction field for a test mask based on a rigorous simulation of the interaction of electric fields with the test mask, by computing a rigorous simulated mask pattern for the test mask using the 3D diffraction field, and by iteratively adjusting the volume kernel based on a comparison between a simulated mask pattern for the test mask and the rigorous simulated mask pattern for the test mask. In an embodiment, the test mask comprises a line pattern layout. In an embodiment, the volume kernel is iteratively adjusted by adjusting the volume kernel if a difference between the simulated mask pattern for the test mask and the rigorous simulated mask pattern for the test mask is greater than an accuracy threshold or if a number of iterations has not exceeded a predetermined number.

Still another embodiment of the disclosure is a tool for making a lithography mask including a processor and a memory operably connected to the processor, and having a computer-executable instructions stored thereon. The instructions when executed by the processor cause the processor to receive a given mask layout. A mask volume correction matrix is computed for a given mask layout to be used to perform a lithography process, the mask volume correction matrix representing a diffraction field for a predetermined thickness of a material of the mask. A simulated mask pattern is computed by applying the mask volume correction matrix to the given mask layout. The simulated mask pattern is provided to a mask printer. In an embodiment, the given mask layout corresponds to a mask for a DUV lithography process or a EUV lithography process. In an embodiment, the corrected 2D diffraction is represented by: Corrected 2D diffraction field=mask volume correction matrix×2D diffraction field=[3D diffraction field×$\chi(r')$]*$G(r,r')$, where $\chi(r')$ represents the pattern-dependent characteristic function, $G(r,r')$ represents the pattern-independent pre-computed kernel, and '*' represents a convolution operation.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A computer-implemented method of mating a mask, the method comprising:
   computing a mask volume correction matrix for a given mask layout to be used to perform a lithography process, wherein
      the mask volume correction matrix represents a diffraction field for a predetermined thickness of a material of the mask, and the mask volume correction matrix is computed by
         calculating a two-dimensional (2D) diffraction field for the given mask layout considering a 2D mask condition, and
         extending the 2D diffraction field to the predetermined thickness of the material of the mask to obtain a three-dimensional (3D) diffraction field representing a 3D diffraction field for the given mask layout provided in the material of the mask;
   computing a simulated mask pattern by applying the mask volume correction matrix to the given mask layout; and
   providing the simulated mask pattern to a mask making tool.

2. The method of claim 1, wherein computing the mask volume correction matrix comprises computing a pattern-independent pre-computed kernel and a pattern-dependent characteristic function.

3. The method of claim 2, wherein computing the pattern-independent pre-computed kernel comprises iteratively adjusting a mask material compensation kernel until a difference between the simulated mask pattern and an ideal simulated pattern computed using a rigorous computation model for a test mask layout is within a predetermined accuracy value.

4. The method of claim 3, wherein the test mask layout comprises a line pattern.

5. The method of claim 1, wherein the given mask layout corresponds to a mask for a deep ultraviolet (DUV) lithography process.

6. The method of claim 1, wherein the given mask layout corresponds a mask for an extreme ultraviolet (EUV) lithography process.

7. The method of claim 1, wherein computing the mask volume correction matrix further comprises:
recomputing a corrected 2D diffraction field at a surface of the mask as a function of the 3D diffraction field.

8. The method of claim 7, wherein the 2D diffraction field is represented by $$E(r) = \sum_m \sum_n E_{mn} e^{jk_{x,mn}x} e^{jk_{y,mn}y} e^{jk_{z,mn}z_0},$$

and the 3D diffraction field is represented by $$\tilde{E}(r') = \sum_m \sum_n E_{mn} e^{jk_{x,mn}x} e^{jk_{y,mn}y} e^{jk_{z,mn}(z-z_0)}$$

wherein $k_x$, $k_y$, $k_z$ are components of a vector wave number k of a particular field E,
the vector wave number k is represented as $k=(k_x,k_y,k_z)$, $k_x=|k|\times\cos(\theta)\times\sin(\varphi)$, $k_y=|k|\times\cos(\theta)\times\cos(\varphi)$, and $k_z=|k|\sin(\theta)$, wherein the vector wave number k has a polar angle represented by $\theta$ and an azimuthal angle represented by $\varphi$,
an absolute value of the vector wave number k is given as $|k|=2\pi f c_0 \times \epsilon_r \times \mu_r$, wherein f is frequency in Hz, $c_0$ is speed of light in vacuum ($3\times10^8$ m/s), $\epsilon_r$ is the relative permittivity, $\mu_r$ is the relative magnetic permeability of the background of the material within which the wave is propagating, r is a vector indicating a location on a two dimensional plane and is represented as $r=(x,y,z_0)$ in Cartesian coordinates, wherein x and y are coordinates on the two dimensional plane and $z_0$ is a real scalar number specifying the z coordinate,
$z_0$ is determined by a given reference plane,
r' is a vector representing a location in a three dimensional space and is represented as $r'=(x,y,z)$ in Cartesian coordinate, wherein x,y,z are coordinates on a 3D volume, and
j is an imaginary number defined as $\sqrt{-1}$.

9. The method of claim 7, wherein the corrected 2D diffraction field is represented by:
Corrected 2D diffraction field=mask volume correction matrix 2D diffraction field=[3D diffraction field×χ(r')]*G(r,r'),
where χ(r') represents a pattern-dependent characteristic function, G(r,r') represents a pattern-independent pre-computed kernel, and '*' represents a convolution operation.

10. The method of claim 7, the corrected 2D diffraction field is represented by

Corrected 2D diffraction field=mask volume correction matrix 2D diffraction field=[3D diffraction field×χ(r')]*G(r,r')+$E_{in}$(r), where χ(r') represents a pattern-dependent characteristic function, G(r,r') represents a pattern-independent pre-computed kernel, $E_{in}$(r) represents an incident optical field, the being a fraction of an illumination radiation, and '*' represents a convolution operation.

11. A computer-implemented method of making a mask, the method comprising:
computing a characteristic function based on a desired layout of the mask;
computing volume kernel based on an interaction of electric field with a predetermined thickness of a material of the mask;
computing a volume compensated two-dimensional (2D) diffraction field for the desired layout of the mask by transforming a multiplicative product of a 2D diffraction field for the desired layout and the characteristic function using the volume kernel;
computing a simulated mask pattern using the volume compensated 2D diffraction field; and
providing the simulated mask pattern to a mask making tool, wherein computing the volume kernel comprises
computing a three-dimensional (3D) diffraction field for a test mask based on a rigorous simulation of the interaction of electric fields with the test mask;
computing a rigorous simulated mask pattern for the test mask using the 3D diffraction field; and
iteratively adjusting the volume kernel based on a difference between a simulated mask pattern for the test mask and the rigorous simulated mask pattern for the test mask or based on a number of iterations, the volume kernel being adjusted until a desired accuracy threshold is obtained or being adjusted until a desired number of iterations are performed.

12. The method of claim 11, wherein the desired layout corresponds to a mask for a DUV lithography process.

13. The method of claim 11, further comprising adding a factor of an incident field to the transformed multiplicative product of the 2D diffraction field for the desired layout and the characteristic function using the volume kernel to obtain the volume compensated 2D diffraction field.

14. The method of claim 13, wherein the desired layout corresponds to a mask for an EUV lithography process.

15. The method of claim 11, wherein the test mask comprises a line pattern layout.

16. The method of claim 11, wherein iteratively adjusting the volume kernel comprises adjusting the volume kernel when the difference between the simulated mask pattern for the test mask and the rigorous simulated mask pattern for the test mask is greater than the desired accuracy threshold or when the number of iterations has not exceeded a predetermined number.

17. A tool for making a lithography mask, the tool comprising:
a processor; and
a memory operably connected to the processor, and having a computer-executable instructions stored thereon, the instructions when executed cause the processor to:
receive a given mask layout;
compute a mask volume correction matrix for a given mask layout to be used to perform a lithography process, wherein the mask volume correction matrix represents a diffraction field for a predetermined thickness of a material of the mask, and
wherein computing the mask volume correction matrix includes computing a corrected two-dimensional (2D) diffraction field, the corrected 2D diffraction field being represented by: Corrected 2D diffraction field=mask volume correction matrix 2D diffraction field=[3D diffraction field×χ(r')]*G(r,r'), where χ(r') represents a pattern-dependent characteristic function, G(r,r') represents a pattern-independent pre-computed kernel, and '*' represents a convolution operation;

compute a simulated mask pattern by applying the mask volume correction matrix to the given mask layout; and provide the simulated mask pattern to a mask printer.

18. The tool of claim 17, wherein the given mask layout corresponds to a mask for a DUV lithography process or a EUV lithography process.

19. The tool of claim 17, wherein computing the mask volume correction matrix further includes:

calculating the two-dimensional (2D) diffraction field for the given mask layout considering a 2D mask condition;

extending the 2D diffraction field to the predetermined thickness of the material of the mask to obtain a three-dimensional (3D) diffraction field representing a 3D diffraction field for the given mask layout provided in the material of the mask; and recomputing a corrected 2D diffraction field at a surface of the mask as a function of the 3D diffraction field.

* * * * *